United States Patent
Mizoguchi et al.

(10) Patent No.: US 8,421,413 B2
(45) Date of Patent: Apr. 16, 2013

(54) BATTERY FAULT DETECTION APPARATUS

(75) Inventors: Tomomichi Mizoguchi, Nagoya (JP); Satoshi Sobue, Aichi-ken (JP)

(73) Assignee: DENSO CORPORATION, Kariya (JP)

( * ) Notice: Subject to any disclaimer, the term of this patent is extended or adjusted under 35 U.S.C. 154(b) by 335 days.

(21) Appl. No.: 12/978,059

(22) Filed: Dec. 23, 2010

(65) Prior Publication Data
US 2011/0156714 A1 Jun. 30, 2011

(30) Foreign Application Priority Data
Dec. 24, 2009 (JP) ................................ 2009-292846

(51) Int. Cl.
H01M 10/46 (2006.01)

(52) U.S. Cl.
USPC ........................................................ 320/119

(58) Field of Classification Search .................. 320/107, 320/116, 118, 119, 122; 324/426, 427, 434; 361/88, 90
See application file for complete search history.

(56) References Cited

U.S. PATENT DOCUMENTS

| 6,404,166 | B1 | 6/2002 | Puchianu | |
| 2005/0073282 | A1* | 4/2005 | Carrier et al. | 320/106 |
| 2009/0230922 | A1* | 9/2009 | Elder et al. | 320/126 |

FOREIGN PATENT DOCUMENTS

| JP | H05-341013 | | 12/1993 |
| JP | P2001-330653 | A | 11/2001 |
| JP | P2009-109252 | A | 5/2009 |
| JP | P2009-183025 | A | 8/2009 |
| JP | P2009-216447 | A | 9/2009 |
| JP | P2010-520733 | A | 6/2010 |
| WO | WO 00/05596 | | 2/2000 |

* cited by examiner

Primary Examiner — Edward Tso
(74) Attorney, Agent, or Firm — Nixon & Vanderhye PC

(57) ABSTRACT

The battery fault determination apparatus includes battery monitor sections connected in a daisy chain, each of which is provided for a corresponding one of unit batteries each including battery cells connected in series to monitor the battery cells and output an output signal indicative of a monitoring result, and a control section configured to output a control signal to the battery monitor sections. The control signal and the output signal are cascaded through the battery monitor sections causing each battery monitor section to perform a state change between a state to monitor overcharge of the battery cells and a state to monitor wire breakage. Each battery monitor section is configured to receive the control signal from the immediately upstream-side battery monitor section, make a detection whether the state change has been performed correctly, and output the output signal including a detection result to the immediately downstream-side battery monitor section.

4 Claims, 9 Drawing Sheets

|  |  | OUT1 | OUT2 |
|---|---|---|---|
| NORMAL | WIRE BREAKAGE DETECTION | L | L |
|  | VOLTAGE DETECTION | H | H |
| FAULTY | WIRE BREAKAGE DETECTION | L | H |
|  | VOLTAGE DETECTION | L | H |

BATTERY FAULT DETECTION APPARATUS

This application claims priority to Japanese Patent Application No. 2009-292846 filed on Dec. 24, 2009, the entire contents of which are hereby incorporated by reference.

BACKGROUND OF THE INVENTION

1. Field of the Invention

The present invention relates to a battery fault detection apparatus used to monitor a battery pack including battery cells connected in series.

2. Description of Related Art

There are proposed various structures to monitor battery cells for industrial use. For example, Japanese Unexamined Patent Application Publication (Translation of PCT Application) No. 2002-521792 discloses a structure to monitor the whole of industrial-use batteries by a battery centralized monitoring system constituted of a plurality of cell monitoring devices connected in a daisy chain.

In this structure, the battery centralized monitoring system outputs a command to perform fault diagnosis to the cell monitoring devices in sequence, and diagnosis results by the cell monitoring devices are successively returned to the battery centralized monitoring system.

Each of the cell monitoring devices may be provided with a fault diagnosing function to detect, for example, wire breakage, and a monitoring function to detect overcharge of the cells. In this case, to enable both these two functions, two types of clock signals may be supplied to the cell monitoring devices in a daisy chain manner, the cell monitoring devices being activated by one type of the clock signal, and being changed between the fault diagnosis state and the overcharge detection state by the other type of the clock signal.

However, the above structure has a problem in that it is not possible to determine whether the monitoring state change between the fault diagnosis state and the overcharge detection state has been performed correctly on the side of the cell monitoring devices. Accordingly, if the monitoring state change has not been performed correctly, an erroneous determination on wire breakage or overcharge of the cells may be made.

SUMMARY OF THE INVENTION

The present invention provides a battery fault determination apparatus for a battery pack including battery cells connected in series and grouped into unit batteries each including a predetermined number of the battery cells, comprising:

battery monitor sections each provided for a corresponding one of the unit batteries to monitor the battery cells and output an output signal indicative of a monitoring result, the battery monitor sections being connected in a daisy chain through wires; and a control section configured to output a control signal to one of the battery monitor sections on the highest-voltage side of the unit batteries;

the control signal and the output signal being cascaded through the battery monitor sections causing each of the battery monitor sections to perform a state change between a first state to monitor overcharge of the battery cells and a second state to monitor wire breakage of the wires;

wherein each of the battery monitor sections includes a state-transition fault detection section configured to receive the control signal from one of the battery monitor sections on the immediately upstream side, make a detection whether the state change has been performed correctly in accordance with the control signal, and output the output signal including a detection result to one of the battery monitor sections on the immediately downstream side, and the control section is configured to receive the output signal from one of the batty monitor sections on the most-downstream side, and determines that there occurs a fault in performing the state change if the detection result included in the received output signal indicates presence of a fault.

According to the present invention, there is provided a battery fault determination apparatus configured to change between two different monitoring states by use of a control signal, and capable of preventing making an erroneous determination when the state change has not been performed correctly.

Other advantages and features of the invention will become apparent from the following description including the drawings and claims.

PREFERRED EMBODIMENTS OF THE INVENTION

First Embodiment

Figure 1:
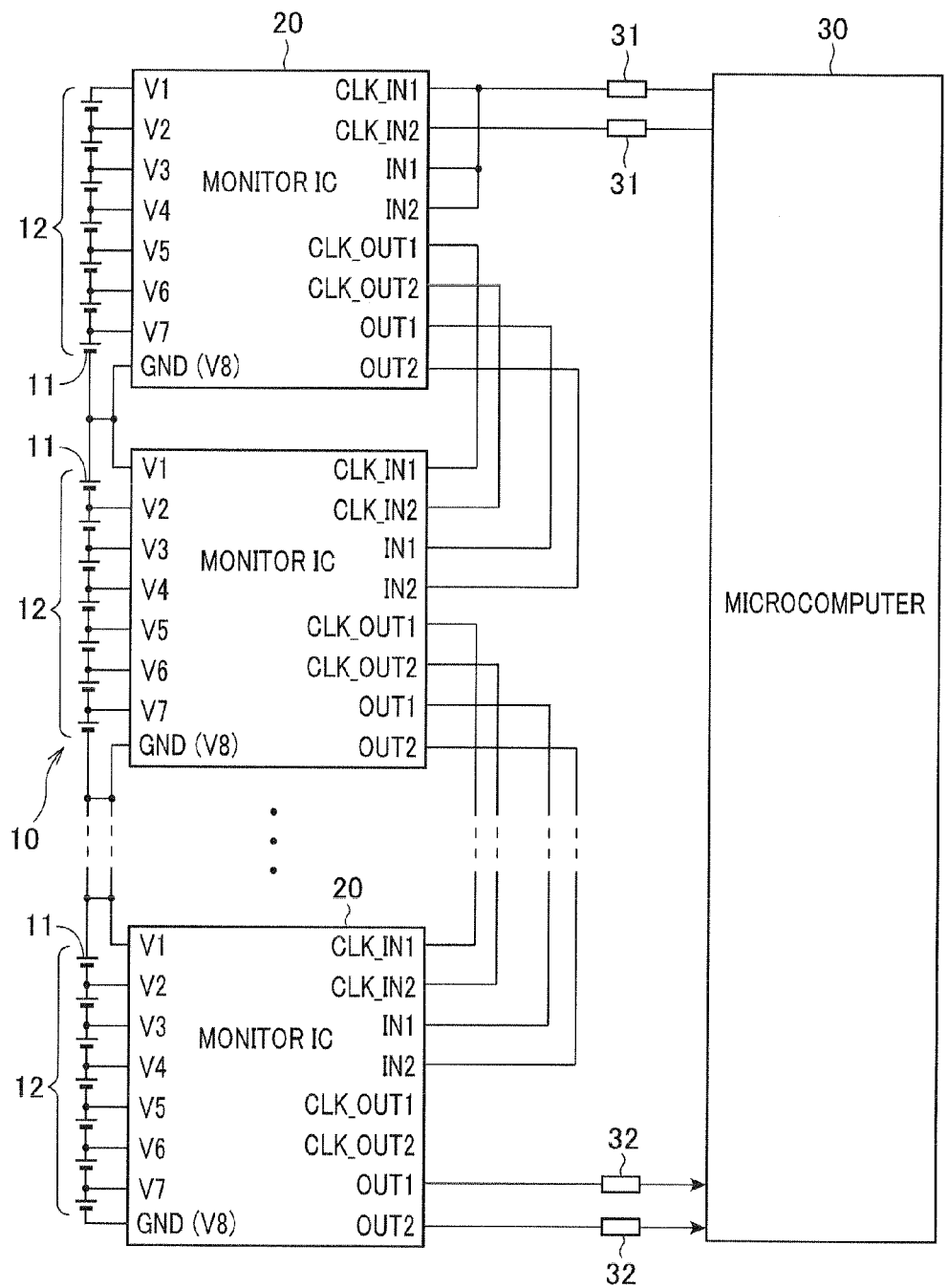
FIG. 1 is a diagram showing the overall structure of a battery control system including a battery fault detection apparatus according to a first embodiment of the invention.

FIG. 1 is a diagram showing the overall structure of a battery control system including a battery fault detection apparatus according to a first embodiment of the invention. As shown in FIG. 1, the battery control system includes a battery pack 10, a plurality of monitor ICs 20 and a microcomputer 30.

The battery pack 10 includes a series connection of a predetermined number of unit batteries 12 each constituted of a predetermined number (7, for example) of rechargeable battery cells 11 connected in series. In this embodiment, a rechargeable lithium-ion battery is used as the battery cell 11.

Each of the monitor ICs 20 has an overcharge/overdischarge detection function to detect overcharge and overdischarge of the battery cells 11, and a wire breakage detection function to detect breakage of wires directly or indirectly connected to the battery cells 11.

The overcharge/overdischarge detection function operates to monitor the battery cells 11 by comparing the voltage of each of the battery cells 11 with a threshold. In the case of the battery cell 11 being a rechargeable battery, the overcharge/overdischarge detection function monitors whether the voltage of the battery cell 11 is between an overcharge detection threshold and an overdischarge detection threshold value. The wire breakage detection function operates to detect breakage of the wires due to circuit component malfunction, for example.

The monitor ICs 20 are provided for respective ones of the unit batteries 12. Each of the monitor ICs 20 is connected to both electrodes of a corresponding one of unit batteries 12 to be supplied with operating power, and performs the overcharge/overdischarge detection function and wire breakage detection function.

The monitor ICs 20 are connected in a daisy chain so that signals flow in a direction from the monitor IC 20 corresponding to the unit battery 12 on the higher voltage side (referred to as "higher-voltage side IC 20" hereinafter) to the monitor IC 20 corresponding to the unit battery 12 on the lower voltage side (referred to as "lower-voltage side IC 20" hereinafter).

Accordingly, control signals (CLK_IN1, CLK_IN2) outputted from the microcomputer 30, and output signals (OUT1, OUT2) outputted from each of the monitor ICs 20 are cascaded from the higher-voltage side monitor ICs 20 to the lower-voltage side monitor ICs 20. Each of the monitor ICs 20 includes terminals for receiving and outputting these signals.

The control signal outputted from the microcomputer 30 is constituted of a first clock signal (CLK_IN1) having a first clock frequency and a second clock signal (CLK_IN2) having a second clock frequency lower than the first clock frequency. The first clock frequency of the first clock signal is not constant but changed depending on the operation of the monitor ICs 20. Each of the monitor ICs 20 is configured to operate in accordance with the first clock signal, and to change its state between the overcharge/overdischarge detection state and the wire breakage detection state upon reception of the second clock signal.

The output signal (OUT1, OUT2) of the higher-voltage side monitor IC 20 makes an input signal (IN1, IN2) of the immediately lower-voltage side monitors IC 20. The first clock signal (CLK_IN1) and the second clock signal (CLK_IN2) from the microcomputer 30 are inputted to the highest-voltage side (the most-upstream side) monitor IC 20. Here, the phrase "the first (or second) signal is inputted" means that the first (or second) clock signal rises to the high level.

Figure 2:
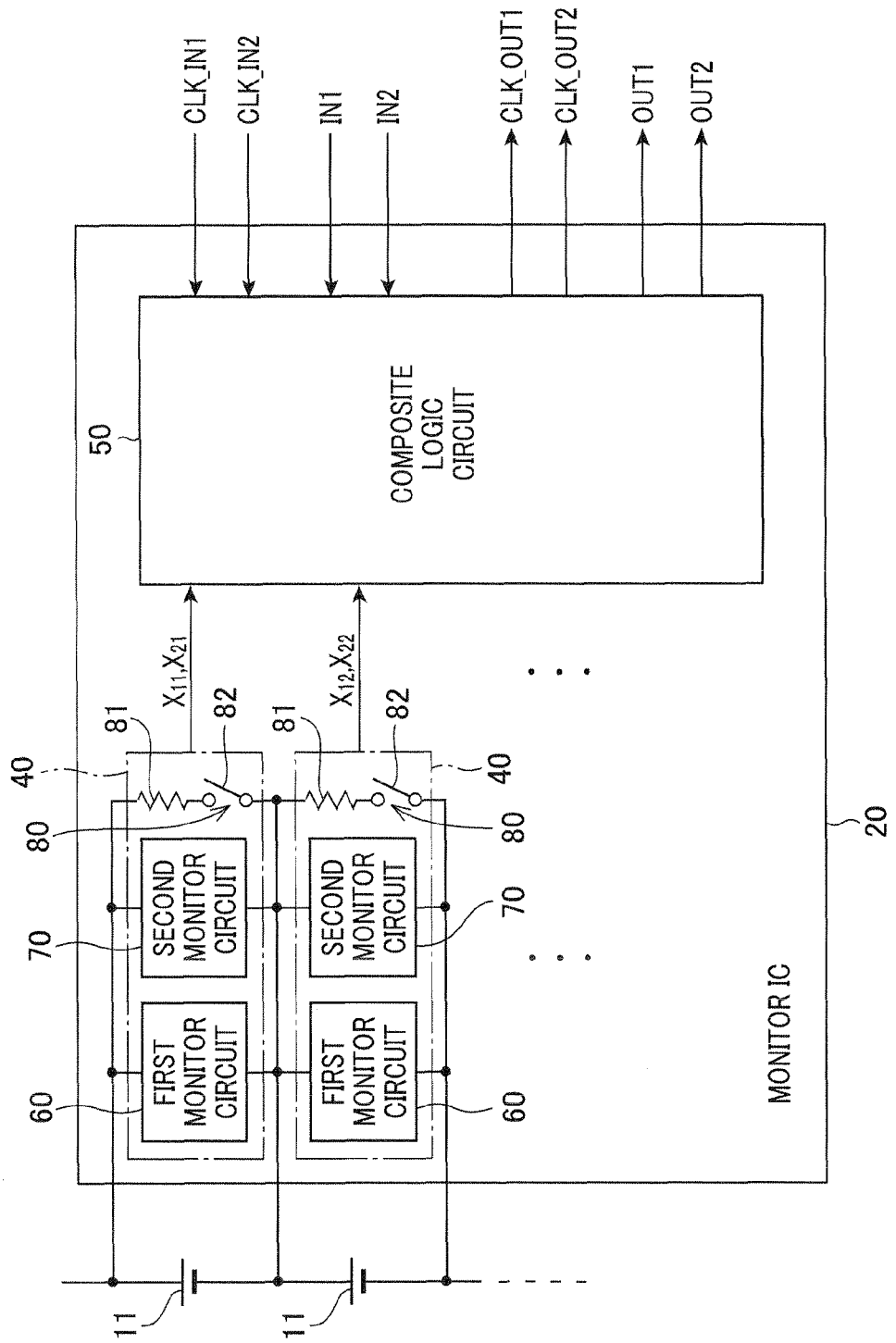
FIG. 2 is a block diagram showing the structure of monitor ICs included in the battery fault detection apparatus of the first embodiment.

FIG. 2 is a block diagram of the monitor IC. As shown in FIG. 2, the monitor IC 20 includes a monitor section 40 and a composite logic section 50. The monitor section 40 includes, for each of the battery cells 11, a first monitor circuit 60, a second monitor circuit 70 and a wire breakage detection section 80.

The first and second monitor circuits 60 and 70 have substantially the same circuit structure to detect overcharge and overdischarge of the battery cell 11. That is, the first and second monitor circuits 60 and 70 constitute a dual-redundant monitor circuit.

Although not shown in FIG. 2, the first clock signal (CLK_IN1) and the second clock signal (CLK_IN2) are inputted to each of the first and second monitor circuits 60 and 70.

Figure 3:
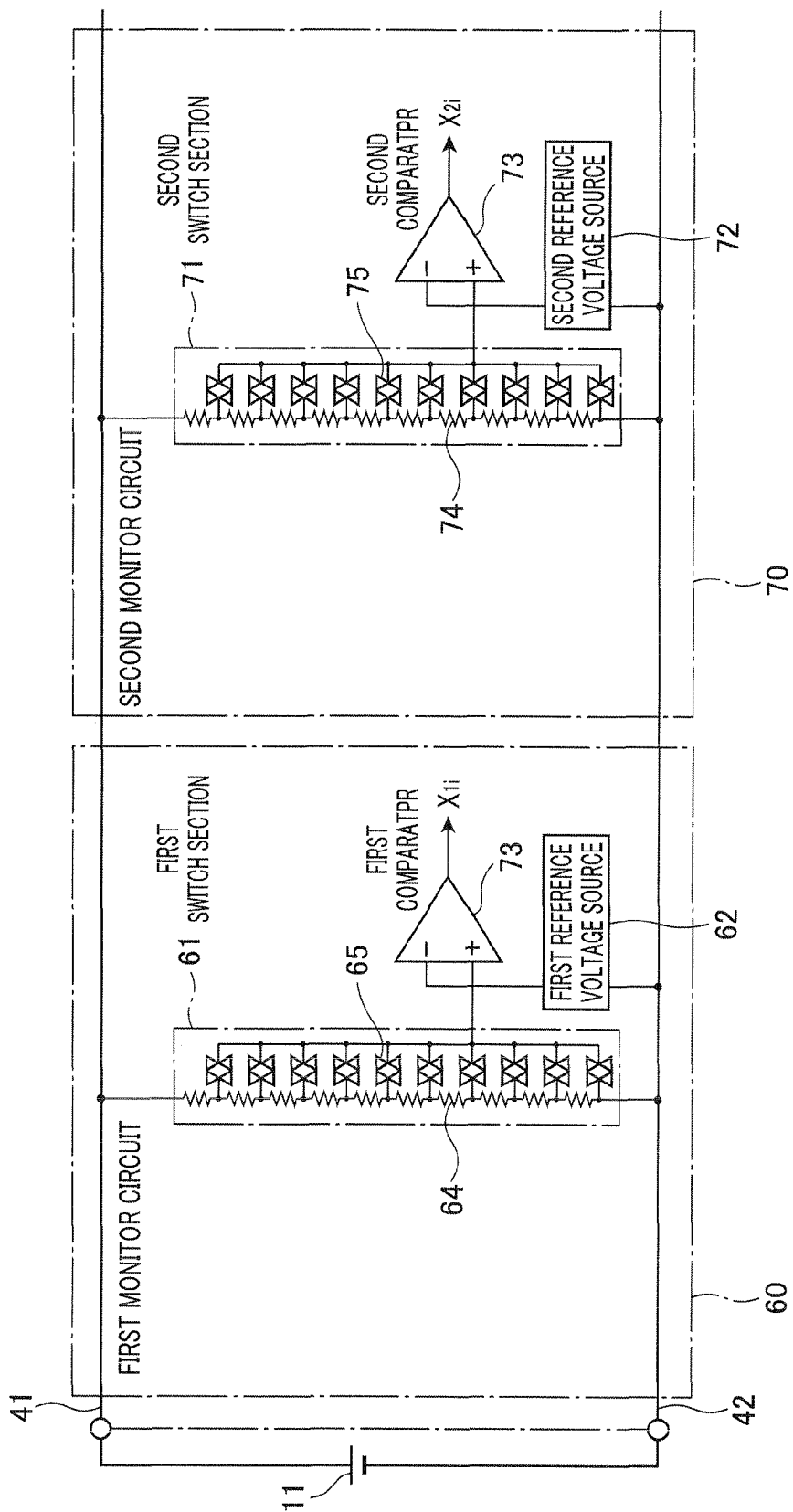
FIG. 3 is circuit diagrams of first and second monitor circuits included in the monitor IC shown in FIG. 2.

FIG. 3 is a diagram showing the circuit structures of the first and second monitor circuits 60 and 70. As shown in FIG. 3, the first monitor circuit 60 includes a first switch section 61, a first reference voltage source 62 and a first comparator 63, and is configured to output a result of comparison between the voltage of the battery cell 11 and a threshold voltage. Likewise, the second monitor circuit 70 includes a second switch section 71, a second reference voltage source 72 and a second comparator 73.

Each of the first and second switch sections 61 and 71 is for generating the threshold voltage from the voltage of the battery cell 11. Each of the first and second switch sections 61 and 71 is connected between a first wire 41 electrically connected to the positive terminal of the battery cell 11 and a second wire 42 electrically connected to the negative terminal of the battery cell 11.

The first switch section 61 includes a plurality of resistors 64 and a plurality of switches 65. The second switching section 71 includes a plurality of resistors 74 and a plurality of switches 75. The resistors 64 are connected in series between the first and second wires 41 and 42. Likewise, the resistors 74 are connected in series between the first and second wires 41 and 42. Each of the switch 65 and switch 75 may be constituted of a resistor and a transistor.

Each of the switches 65 is connected to a connection node of corresponding two of the resistors 64. The switches 65 are connected in parallel to one another. Each of the connection nodes is connected to the non-inverting terminal (positive terminal) of the first comparator 63 through corresponding one of the switches 65.

In this embodiment, eleven resistors 64 are connected in series, and ten switches 65 are respectively connected to the respective connections nodes of the resistors 64. One of the resistors 64, which is the closest to the second wiring 42 is a variable resistor for overcharge detection. On the other hand, one of the resistors 64 which is the closest to the first wiring 41 is a resistor for overdischarge detection. The switches 75, resistors 74 and second comparator are in the same connection relationship as that described above.

When one of the switches 65 (or 75) is turned on, the voltage of the battery cell 11 is divided by the resistors 64 (or 74), and the divided voltage is applied to the non-inverting input terminal of the comparator 63 (or 73) as the threshold voltage. Accordingly, when the switch 65 (or 75) closest to the first wiring 41 is turned on, the voltage divided by the resistor 64 (or 74) connected to the first wire 41 and the series connection of ten resistors 64 (or 74) connected to the second wire 42 is inputted to the comparator 63 (or 73) as the threshold voltage, that is, as an overdischarge detection threshold.

As explained above, by turning on a selected one of the switches 65 (or 75), the divided voltage corresponding to one of the overcharge detection threshold, first to eighth thresholds, and overdischarge detection threshold is outputted to the comparator 63 (or 73) through the switch section 61 (or 71) as the threshold voltage.

The voltage values of the overcharge detection threshold, first to eighth thresholds, and overdischarge detection threshold are set within the range of the output voltage of the battery cell 11. In the case where a lithium-ion battery is used as the battery cell 11, the voltage value of the overcharge detection threshold set in the first monitor circuit 60 is 4.05 V, and the voltage value of the overcharge detection threshold set in the second monitor circuit 70 is 4.25 V, for example. As explained above, although the first and second monitor circuits 60 and 70 constitute a dual-redundant monitor circuit, voltage values of their overcharge detection thresholds are somewhat different from each other. The voltage value of the overdischarge detection thresholds respectively set in the first and second monitor circuits 60 and 70 are set to 2.0 V, for example.

The first to eighth thresholds can be used to perform self-diagnosis to detect threshold characteristic deviation. The first to eighth thresholds have values changing stepwise by a constant value. For example, when the constant value is 0.1 V, the difference between the first threshold and the second threshold is 0.1 V, and the difference between the second threshold and the third threshold by 0.1 V. The threshold characteristic deviation can be detected on the basis of the outputs of the comparator 63 or 73 when the first to eighth thresholds are successively inputted to the comparator 63 or 73 during the self-diagnosis.

The reference voltage source 62 generates a first constant reference voltage. The reference voltage source 72 generates a second constant reference voltage. The reference voltage source 62 is connected between the inverting terminal (negative terminal) of the comparator 63 and the second wire 42. The reference voltage source 72 is connected between the inverting terminal (negative terminal) of the comparator 73 and the second wire 42.

The comparator 63 receives the threshold voltage outputted from the switch section 61 and the first reference voltage outputted from the reference voltage source 62, and outputs a first output indicative of a result of comparison between these received voltages. The comparator 73 receives the threshold voltage outputted from the switch section 71 and the second reference voltage outputted from the reference voltage source 72, and outputs a second output indicative of a result of comparison between these received voltages.

In the comparators 63 (or 73), the first (or second) reference voltage is applied to the inverting terminal, and the threshold voltage is applied to the non-inverting terminal. Accordingly, when the threshold voltage is higher than or equal to the first (or second) reference voltage, the first (or second) output is a high-level signal, and when the threshold voltage is lower than the first (or second) reference voltage, the first (or second) output is a low-level signal. The first and second outputs are supplied to the composite logic section 50.

The wire breakage section 80 is constituted of a resistor 81 and a switch 82 to detect breakage of the first and second wires 41 and 42 connected to the battery cell 1. A wire breakage determination is made such that the switch 82 of the wire breakage detection section 80 of the higher-voltage side one of two neighboring monitor sections 40 is turned on, and the switch 82 of the wire breakage detection section 80 of the lower-voltage side one of the two neighboring monitor sections 40 is turned off, and in this state, the outputs of the first and second comparators 63 and 73 of the first and second monitor circuits 60 and 70 of the lower-voltage side monitor section 40 are detected as basis for the determination. This determination is performed by the microcomputer 30.

In the following description, the first output of the first comparator 63 is designated by $X_{1i}$, and the second output of the second comparator 73 is designated by $X_{2i}$. Here, the letter represents a number to identify the battery cells constituting one unit battery 12 from one another. In this embodiment, since the unit battery 12 is constituted of seven battery cells 11, i=1 to 7.

The composite logic section 50 determines whether or not each monitor section 40 has changed correctly from the overcharge/overdischarge detection state to the wire breakage detection state when the second clock signal is inputted to each monitor section 40, and outputs the determination result as apart of the output signal of the monitor IC 20.

Figures 4, 5:
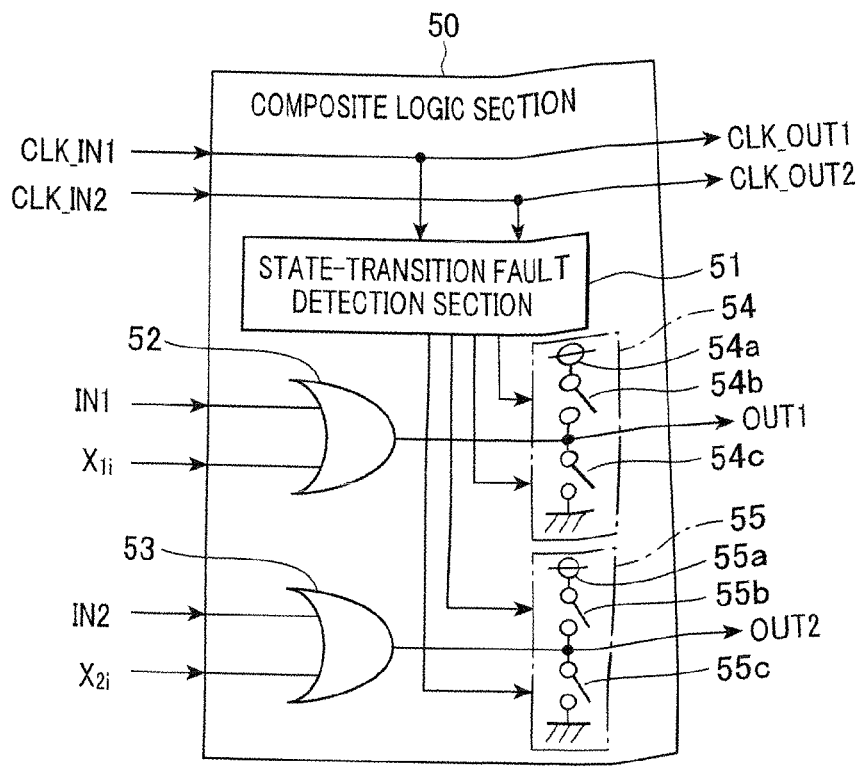
FIG. 4 is a diagram showing the structure of a composite logic section included in the monitor IC shown in FIG. 2.
FIG. 5 is a list showing specific logic patterns generated by pattern generation sections included in the composite logic section.

FIG. 4 is a diagram showing the structure of the composite logic section 50. As shown in FIG. 4, the composite logic section 50 includes a state-transition fault detection section 51, OR circuits 52 and 53, and pattern generation sections 54 and 55.

The state-transition fault detection section 51 receives the first and second clock signals, and detects whether or not the monitoring state change between the overcharge/overdischarge detection state and the wire breakage detection state has been performed correctly in accordance with the first and second clock signals.

More specifically, the state-transition fault detection section 51 detects whether the first clock signal remains at the same level from when the second clock signal was received at the previous time to when the second clock signal is received this time. That is, the state-transition fault detection section 51 operates to detect a signal level fixing where the signal level does not change. When it is detected that monitoring state change is performed correctly, or when such a fault (signal level fixing) is detected, the state-transition fault detection section 51 outputs a command signal to generate one of predetermined patterns to distinguish between normal and fault conditions to the pattern generation sections 54 and 55.

The OR circuit 52 outputs a high-level signal when at least one of the input signal IN1 received from the higher-voltage side monitor IC 20 and the first output $X_{1i}$ of the first comparator 63 of the monitor section 40 is at the high level. Likewise, the OR circuit 53 outputs a high-level signal when at least one of the input signal IN2 received from the higher-voltage side monitor IC 20 and the second output $X_{2i}$ of the second comparator 73 of the monitor section 40 is at the high level.

The pattern generation section 54 outputs an output signal OUT1 constituted of the output signal of the OR circuit 52 included with the generated predetermined pattern. The pattern generation section 54 includes a voltage source 54a, and switches 54b and 54c. The voltage source 54a is for generating a constant voltage. The switch 54b is connected to the voltage source 54a at one contact thereof, and connected to the output terminal of the OR circuit 52 at the other contact thereof. The switch 54c is connected to the output terminal of the OR circuit 52 at one contact thereof, and grounded at the other contact thereof. Each of the switches 54b and 54c may be constituted of a resistor or a transistor, and controlled by a command from the state-transition fault detection section 51.

According to the pattern generation section 54, when the switch 54b is on and the switch 54c is off, since the voltage of the output terminal of the OR circuit 52 is fixed to the constant voltage generated by the voltage source 54a, the first output is forcibly made a high-level signal. On the other hand, when the switch 54b is off and the switch 54c is on, since the voltage of the output terminal of the OR circuit 52 is fixed to the ground voltage, the first output is forcibly made a low-level signal. In this way, the pattern generation section 54 outputs the output signal OUT1 formed by forcibly combining the first output with the generated predetermined pattern by performing switching between the switch 54b and the switch 54c.

Likewise, the pattern generation section 55 includes a voltage source 55a, and switches 55b and 55c. The switch 55b is connected to the voltage source 55a at one contact thereof, and connected to the output terminal of the OR circuit 53 at the other contact thereof. The switch 55c is connected to the output terminal of the OR circuit 53 at one contact thereof, and grounded at the other contact thereof. Like the pattern generation section 54, the pattern generation section 55 outputs the output signal OUT2 formed by forcibly combining the second output with the generated predetermined pattern by performing switching between the switch 55b and the switch 55c in accordance with a command from the state-transition fault detection section 51.

To form the output signal OUT 1 or OUT 2 by combining a detection result indicating that the monitoring state change has not been performed correctly with the output signal of the OR circuit 52 or 53, the state-transition fault detection section 51 causes the pattern generation sections 54 and 55 to generate the corresponding predetermined pattern.

FIG. 5 is a diagram showing the predetermined patterns generated by the pattern generation sections 54 and 55. In FIG. 5, the letter L indicates a low-level signal, and the letter H indicates a high-level signal.

As shown in FIG. 5, when the voltage detection state is changed correctly to the wire breakage detection state in the monitor section 40, the pattern where OUT1=L and OUT2=L is generated. When the wire breakage detection state is changed correctly to the voltage detection state in the monitor section 40, the pattern where OUT1=H and OUT2=H is generated. Accordingly, when the output signal (OUT1, OUT2) of the composite logic section 50 includes the pattern of a combination of H and H or a pattern of a combination of L and L, it indicates that the monitoring state change has been performed correctly.

Figure 6:
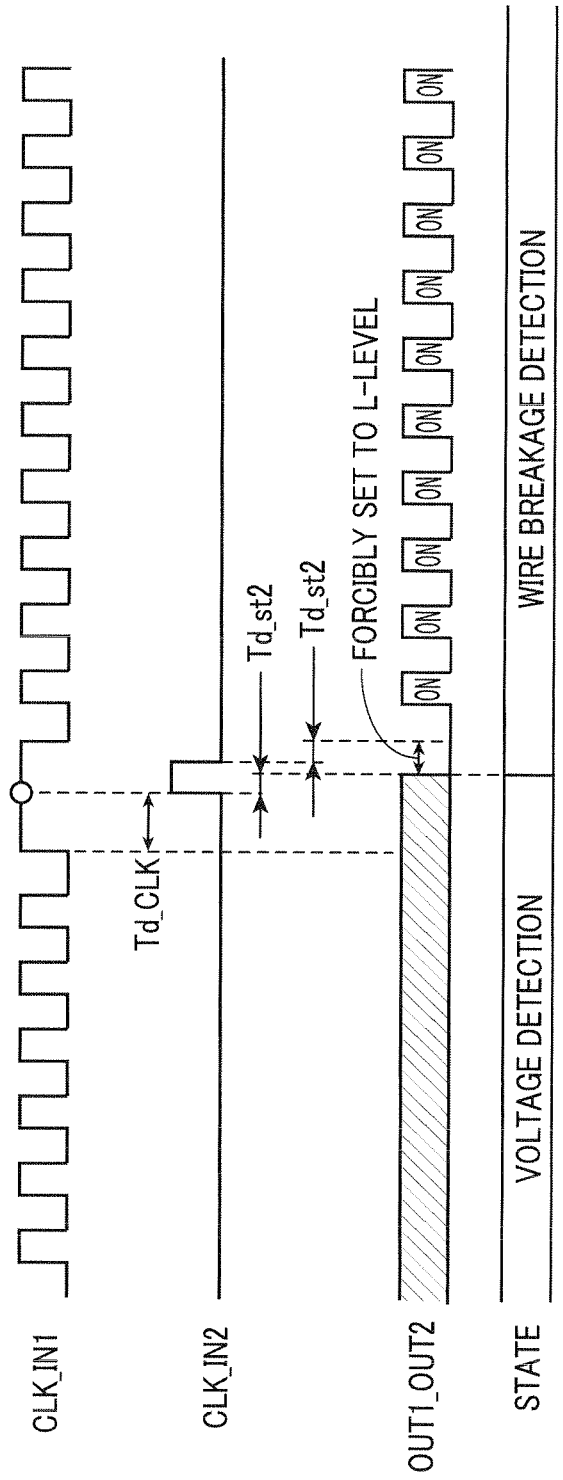
FIG. 6 is a diagram showing an example of a timing chart of the composite logic section when the monitor IC is changed from a voltage detection state to a wire breakage detection state.

FIG. 6 is a timing chart showing a transition from the voltage detection state to the wire breakage detection state. As shown in FIG. 6, during the voltage detection state shown by the shaded portion, a detection result is indicated as the output signal (OUT1, OUT2). After an elapse of time of Td_CLK from the time when the first clock signal (CLK_IN1) rises, the second clock signal (CLK_IN2) rises to change the voltage detection state to the wire breakage detection state. That is, the monitoring state transition takes place on condition that the first clock signal is at the low level, and the second clock signal is at the high level. Thereafter, for example, after an elapse of time of Td_st2, the monitor section 40 changes from the voltage detection state to the wire breakage detection state.

The output signal (OUT1, OUT2) is forcibly set to (L, L) by the pattern generation sections 54 and 55 at the timing at which the second clock signal rises and the transition from the voltage detection state to the wire breakage detection state takes place, that is, when the second clock signal is inputted to the state-transition fault detection section 51. The output signal (OUT1, OUT2)=(L, L) is maintained unchanged until the time of Td_st2 lapses after the second clock signal falls. Thereafter, this output signal is made the result of the wire breakage detection.

FIG. 6 shows the case where the output signal (OUT1, OUT2) is generated as (L, L), however, the same explanation is true of the case where the output signal (OUT1, OUT2) is generated as (H, H) when the wire breakage detection state is changed to the voltage detection state. That is, the state transition from the wire breakage detection state to the voltage detection state takes place on condition that the first clock signal is at the high level and the second clock signal is at the high level.

On the other hand, if the monitor section 40 does not change correctly from the voltage detection state to the wire breakage detection state, or vice versa, the pattern where the OUT1=L and OUT2=H is generated. If the output signal (OUT1, OUT2) includes a pattern of a combination of L and H, it means that the monitoring state change has not been performed correctly, but there is a fault in the monitor section 40.

The first clock signal (CLK_IN1) and the second clock signal (CLK_IN2) which have passed through the composite logic circuit 50 are supplied to the lower-voltage side (the downstream side) monitor IC 20. Also the output signal (OUT1, OUT2) included with the pattern generated by the composite logic section 50 is supplied to the lower-voltage side monitor IC 20.

The microcomputer 30, which includes a CPU, a ROM, an EEPROM and a RAM, operates in accordance with a program stored in the ROM to monitor overcharge and overdischarge of the battery cells 11, and wire breakage.

The microcomputer 30 supplies, as control signals, the first clock signal (CLK_IN1) and the second clock signal (CLK_IN2) to the respective monitor ICs 20 connected in a daisy chain, so that each of the monitors IC 20 performs the voltage detection and the wire breakage detection in an alternating sequence. The microcomputer 30 is configured to output the second clock signal each time it outputs the first clock signal a predetermined number of times.

The microcomputer 30 outputs the first and second clock signals to the monitor IC 20 on the highest-voltage side (most upstream side) through photo couplers 31. The microcomputer 30 also receives the output signal (OUT1, OUT2) from the monitor IC 20 on the lowest-voltage side (most downstream side) through photo couplers 32, in order to acquire results of the voltage detection and wire breakage detection.

Also, the microcomputer 30 determines, when the pattern included in the output signal indicates that the monitoring state change between the overcharge/overdischarge detection state and the wire breakage detection state has not been performed correctly, determines that there occurs a fault.

Next, the operation of the state-transition fault detection section 51 to generate the above patterns is explained with reference to FIGS. 7 and 8. Here, the explanation is made to the monitor IC on the second-highest-voltage side.

Figure 7:
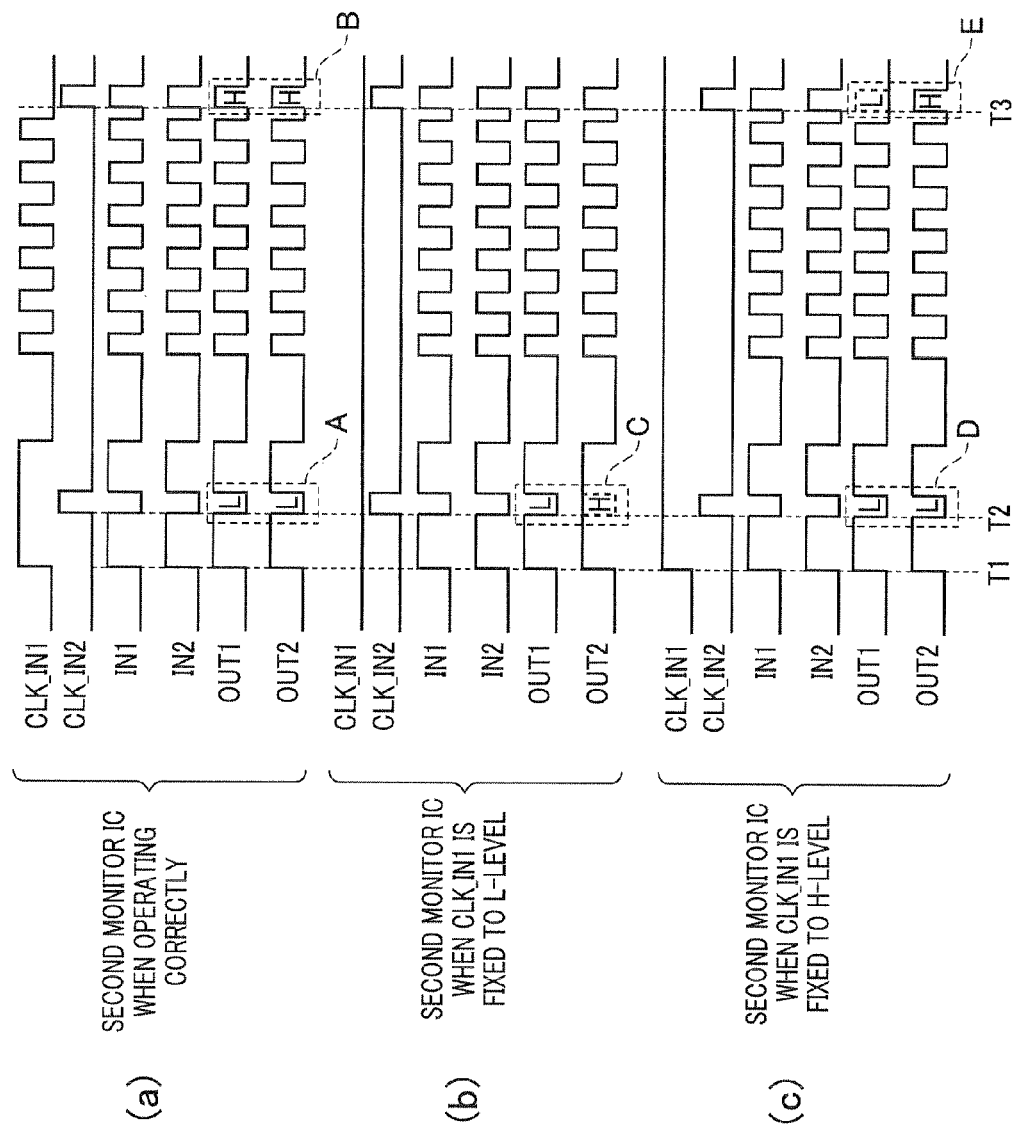
FIG. 7 is a timing chart for explaining the operation of the composite logic section.

The section (a) of FIG. 7 shows a timing chart when the first clock signal (CLK_IN1) is normal. In this figure, it is assumed that the monitor IC 20 is in the voltage detection state until time t1. At time T1, the first clock signal rises, and thereafter, the second clock signal (CLK_IN2) rises at time T2. The rise of the second clock signal makes a command from the microcomputer 30 to change the monitor IC 20 from the voltage detection state to the wire breakage detection state.

The signals designated by IN1 and IN2 are the output signal (OUT1, OUT2) of the monitor IC 20 on the highest-voltage side.

The state-transition fault detection section 51 of the composite logic section 50 causes, upon detecting that the first and second clock signals inputted thereto are normal, the pattern generation sections 54 and 55 to generate the corresponding pattern. At this time, since the voltage detection state is changed to the wire breakage detection state, the output signal is the combination of OUT1=L and OUT2=L as shown in FIG. 5.

Accordingly, in this case, the output signal including the pattern of OUT1=L and OUT2=L shown in the broken-line square A in the section (a) of FIG. 7 is outputted. The section (a) of FIG. 7 shows that the output signal is outputted at the same time when the second clock signal rises, however, actually, the output signal is outputted after a lapse of a certain time from the rise of the second clock signal at time T2.

Thereafter, the second clock signal rises at time T3, and as a result, the monitor IC 20 is changed from the wire breakage detection state to the voltage detection state. Subsequently, the state-transition fault detection section 51 causes, upon detecting that the first and second clock signals inputted thereto are normal, the pattern generation sections 54 and 55 to generate the corresponding pattern. At this time, since the wire breakage detection state is changed to the voltage detection state, the output signal is the combination of OUT1=H and OUT2=H as shown in FIG. 5. Accordingly, in this case, the output signal including the pattern of OUT1=H and OUT2=H shown in the broken-line square B in the section (a) of FIG. 7 is outputted.

The above pattern included in the output signal is supplied to the microcomputer 30 through the monitor ICs connected in a daisy chain. The microcomputer 30 determines that the monitoring state has been changed correctly upon detecting that the response (the pattern included in the received output signal) conforms to the outputted state-change command (the second clock signal).

On the other hand, when there occurs a fault that the first clock signal is fixed to the low level, the state-transition fault detection section 51 continues to receive the first clock signal at the low level until the second clock signal is received at time T2, as shown in the section (b) of FIG. 7. Such a fault occurs due to malfunction of the circuit of the monitor IC 20, for example.

In this case, since the state-transition fault detection section 51 does not receive the first clock signal even though the second clock signal has been received, the state-transition fault detection section 51 determines that there is a fault in the first clock signal. More specifically, since the monitor section 40 does not operate correctly unless the monitor IC 20 receives the first clock signal to control the monitor section 40, even if the second clock signal is inputted to the monitor IC 20 causing the monitoring state to change from the voltage detection state to the wire breakage detection state, the state-transition fault detection section 51 detects a fault.

As a result, the state-transition fault detection section 51 causes the pattern generation sections 54 and 55 to generate the pattern of OUT1=L and OUT2=H indicative of presence of a fault to be included in the output signal. Accordingly, as shown in the broken-line square C in the section b) of FIG. 7, the output signal including this specific pattern including the combination of OUT1=L and OUT2=H is outputted.

Figure 8:
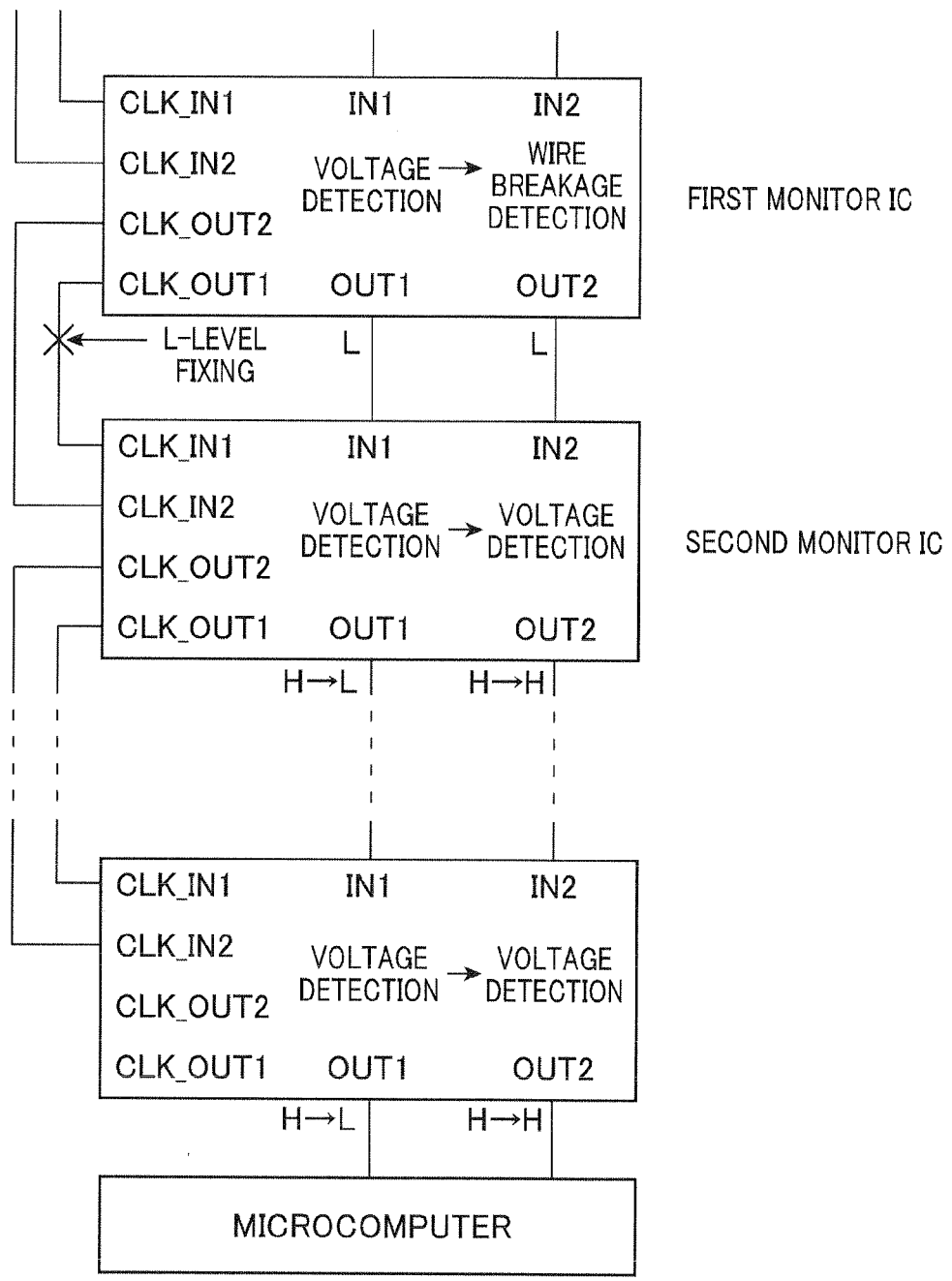
FIG. 8 is an explanatory diagram showing how output signals of the monitor ICs are changed to include a specific pattern when a fault occurs in the battery control system of the first embodiment.

FIG. 8 is an explanatory diagram showing how the output signals of the monitor ICs 20 connected in a daisy chain are changed to include the pattern indicative of presence of a fault. In the case of FIG. 8, the first-stage (the highest-voltage side) monitor IC 20 has changed from the voltage detection state to the wire breakage detection state, however, the first clock signal (CLK_OUT1) outputted from the first-stage monitor IC 20 is fixed to the low level L. Accordingly, the second-stage monitor IC 20 does not change from the voltage detection state to the wire breakage detection state, and outputs the output signal including the pattern of OUT1=L and OUT2=H.

The microcomputer 30 determines that there has occurred a fault in changing the monitoring state upon detecting that the specific pattern indicative of presence of a fault is included in the received output signal.

Meanwhile, when there occurs a fault that the first clock signal is fixed to the high level, the first clock signal remains at the high level after it rises at time T1 as shown in the section (c) of FIG. 7.

In this case, since the first clock signal rises correctly at time T1, and the second clock signal rises correctly at time T2 to change the voltage detection state to the wire breakage detection state. Accordingly, the state-transition fault detection section 51 determines that there is no fault in the received first and second clock signals, and causes the pattern generation sections to generate the specific pattern indicative of the monitoring state having been changed correctly. Accordingly, as shown in the broken-line square D in the section (c) of FIG. 7, the output signal including this specific pattern including the combination of OUT1=H and OUT2=H is outputted.

Since the first clock signal remains at the high level thereafter, the wire breakage detection is not performed correctly after time T2. The state-transition fault detection section 51 continues to receive the first clock signal fixed to the high level until it receives the second clock signal at time T3. Since the first clock signal received by the state-transition fault detection section 51 remains at the same level ("H-level fixing") from when the second signal was received previous time and to when the second signal is received this time, the state-transition fault detection section 51 determines that there is a fault in the clock signal, and causes the pattern generation sections 54 and 55 to generate the pattern including the combination of OUT1=L and OUT2=H. Accordingly, the output signal including this specific pattern including the combination of OUT1=H and OUT2=H as shown in the broken-line square E of the section (c) of FIG. 7 is outputted.

As explained above, also when the first clock signal is fixed to the high level, since "L-level fixing" makes "H-level fixing" as shown in FIG. 8, and the second-stage monitor IC 20 does not change from the voltage detection state to the wire breakage detection state, the output signal having the pattern including the combination of OUT1=L and OUT2=H is outputted.

As a result, as in the case of the section (b) of FIG. 7, the microcomputer 30 determines that there has occurred a fault in changing the monitoring state upon detecting that the received output signal includes the specific pattern indicative of presence of a fault in changing the monitoring state.

Incidentally, although the above explanation is on the second-highest-voltage side monitor IC 20, the same explanation is true of the other monitor ICs 20.

As described above, the first embodiment includes the state-transition fault detection section 51 to detect a fault in the clock signals of the monitor ICs 20 connected in a daisy chain, and the pattern generation sections 54 and 55 to generate the specific patterns indicative of whether the state transition is performed correctly or not.

According to the first embodiment, it is possible to detect whether the monitor ICs 20 receiving the clock signals can change their monitoring state as instructed by the microcomputer 30 based on the clock signals. Further, it is also possible to have the specific pattern reflecting the detection result generated by the pattern generation sections 54 and 55 be included in the output signal outputted to the microcomputer 30. Accordingly, the microcomputer 30 can determine whether the monitor ICs 20 are performing their state transitions correctly in accordance with the command outputted from the microcomputer 30.

Hence, since the microcomputer 30 can determine whether the monitoring state change has been performed correctly in each of the monitor ICs 20, it is possible to prevent the microcomputer 30 from making an erroneous determination on the received output signal.

In the first embodiment, when the state transition is not being performed correctly, the output signal has the specific pattern including the combination of OUT1=L and OUT2=H as shown in FIG. 5. This is because the overcharge threshold (4.05 V) set in the first monitor circuit 60 is lower than the overcharge threshold (4.25 V) set in the second monitor circuit 70. In more detail, when the voltage of the battery cell 11 increases, the first output $X_{1i}$ of the first monitor circuit 60 changes to the high level earlier than the second monitor circuit 70, and thereafter the second output $X_{2i}$ of the second monitor circuit 70 changes to the high level. Accordingly, when the second output $X_{2i}$ of the second monitor circuit 70 is at the high level, the first output $X_{1i}$ of the first monitor circuit 60 is at the high level naturally. Therefore, it is not possible that the output signal has the pattern including the combination of OUT1=L and OUT2=H. Hence, by generating the output signal having the pattern including the pattern of OUT1=L and OUT2=H, it is possible to make a distinction between the pattern indicating presence of a fault of overcharge in the battery cell and the pattern indicating presence of a fault in the monitor IC 20.

Second Embodiment

Next, a second embodiment of the invention is described with emphasis on a difference with the first embodiment. In the above first embodiment, the state-transition fault detection section 51 is configured to detect a fault in the first clock signal, while in the second embodiment, the state-transition fault detection section 51 is configured to detect a fault in the second clock signal.

More specifically, in the second embodiment, the state-transition fault detection section 51 detects a case where the second clock signal is not received over a period in which the first clock signal has been received a predetermined number of times, and a case where the second clock signal remains at the same level although the first clock signal has been received a predetermined number of times after the second clock signal was received. In the following, there is provided an explanation of the operation of the state-transition fault detection section 51 to cause the pattern generation sections 54 and 55 to generate the specific pattern indicative of the monitoring state not having been changed correctly, and to output the output signal having this specific pattern with reference to FIGS. 9 and 10. Like the first embodiment, this explanation is made on the second-highest-voltage side monitor IC 20.

Figure 9:
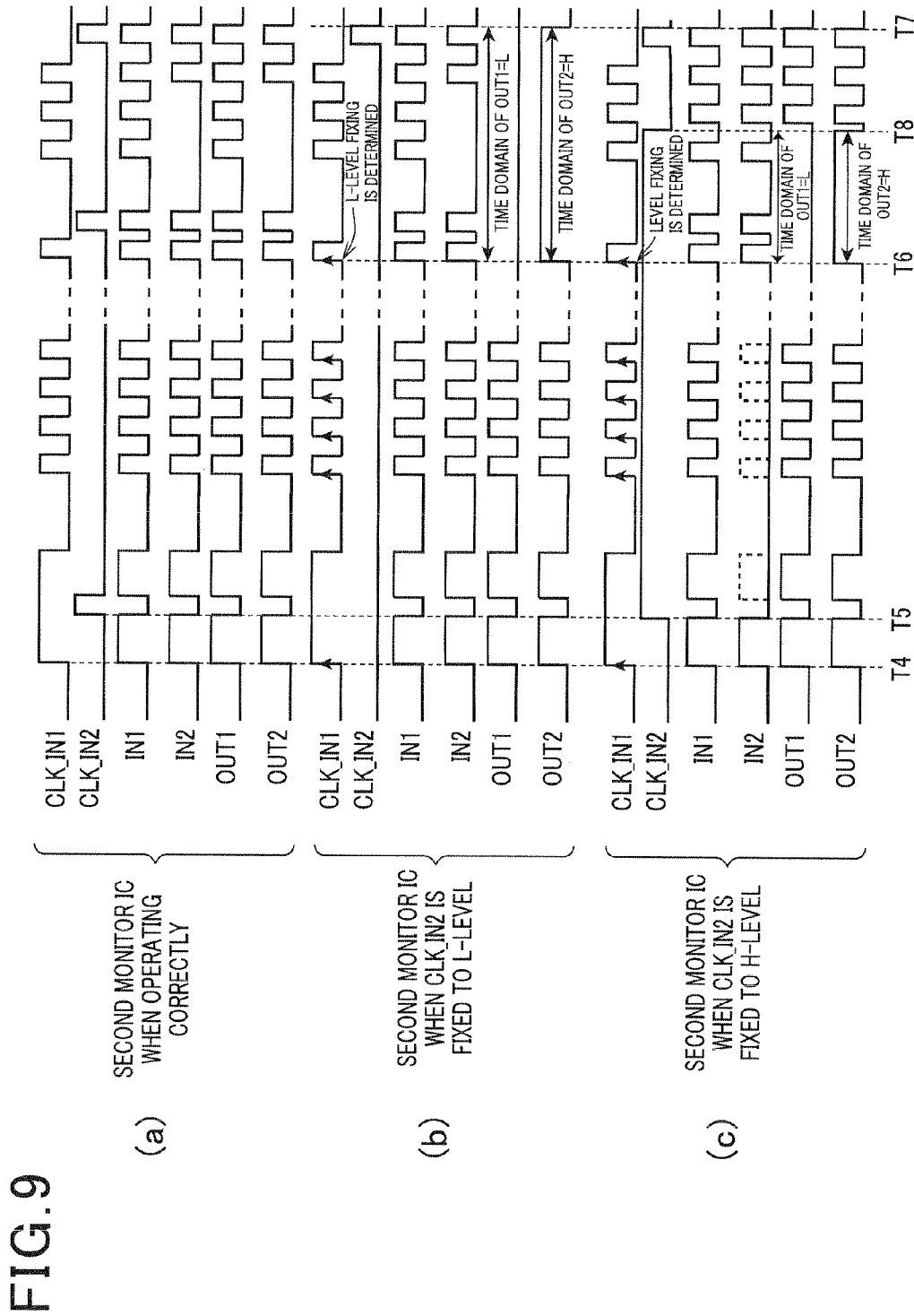
FIG. 9 is a timing chart for explaining the operation of a battery control system including a battery fault detection apparatus according to a second embodiment of the invention.

In the section (a) of FIG. 9, it is assumed that the monitor IC 20 is in the voltage detection state until time T4. At time T4, the first clock signal rises, and thereafter, the second clock signal rises at time T5, as a result of which the monitor IC 20 changes from the voltage detection state to the wire breakage detection state.

The state-transition fault detection section 51 counts the number of times that the first clock signal has risen after time T4 at which the first clock signal starts to be received. When the counted number reaches a predetermined number (3 or 6 or 14, for example), the state-transition fault detection section 51 determines that no fault is present in the second clock signal, and causes the pattern generation sections 54 and 55 to generate the corresponding pattern.

If there occurs a fault that the second clock signal is fixed to the low level, the second clock signal does not rise although it had been supposed to rise at time T5, and remains at the low level. Such a fault in the second clock signal occurs due to malfunction of the circuit of the monitor IC 20, for example.

The state-transition fault detection section 51 determines that there occurs a fault in the second clock signal at time T6 at which the number of times of rise of the first clock signal has reached the predetermined number, and the second clock signal has been determined to be fixed to the low level. Thereafter, the state-transition fault detection section 51 causes the pattern generation sections 54 and 55 to generate the corresponding pattern including the combination of OUT1=L and OUT2=H to be included in the output signal.

As a result, the output signal having the pattern including the combination of OUT1=L and OUT2=H continues to be outputted during a terminal-fixed time domain from time T6 at which the second clock signal is received correctly to time T7 at which the second clock signal falls.

Figure 10:
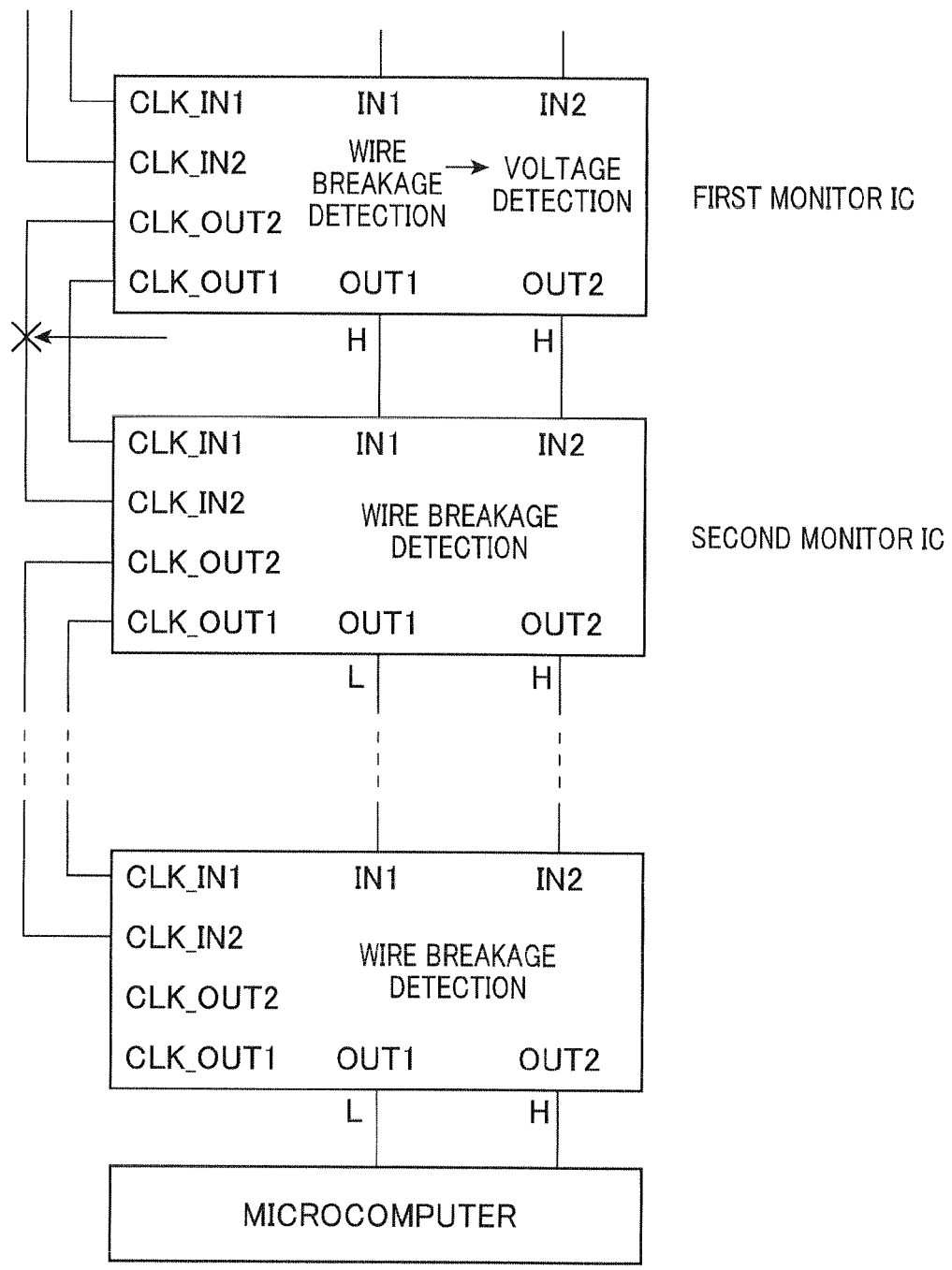
FIG. 10 is an explanatory diagram showing how output signals of the monitor ICs are changed to include a specific pattern when there occurs a fault in the battery control system of the second embodiment.

FIG. 10 is an explanatory diagram showing how the output signals of the monitor ICs 20 connected in a daisy chain are changed to include the specific pattern indicative of presence of a fault. In the case of FIG. 10, the first-stage monitor IC 20 changes from the wire breakage detection state to the voltage detection state, however, the second clock signal (CLK_OUT2) outputted from the first-stage monitor IC 20 is fixed to the low level L. Accordingly, the second-stage monitor IC 20 does not change from the wire breakage detection state to the voltage detection state, and outputs the output signal having the pattern including the combination of OUT1=L and OUT2=H.

As a result, the microcomputer 30 detects that the received output signal includes the specific pattern, and determines that there has occurred a fault in changing the monitoring state.

On the other hand, when there occurs a fault that the second clock signal is fixed to the high level, the second clock signal remains at the high level after it rises at time T5 as shown in the section (c) of FIG. 9. Accordingly, the state-transient fault detection section 51 counts the number of times that the first clock signal has risen after T4 at which the first clock signal starts to be received, and determines that a fault has occurred in the second clock signal when the counted number has reached the predetermined number, and the second clock signal is determined to be fixed to the high level. Thereafter, the state-transition fault detection section 51 causes the pattern generation sections 54 and 55 to generate the corresponding pattern including the combination of OUT1=L and OUT2=H to be included in the output signal.

As a result, the output signal having the pattern including the combination of OUT1=L and OUT2=H continues to be outputted during a terminal-fixed time domain from time T6 to time T7 at which the second clock signal falls. As explained above, also when the second clock signal is fixed to the high level, since "L-level fixing" makes "H-level fixing" as shown in FIG. 10, and the second-stage monitor IC 20 does not change from the wire breakage detection state to the voltage detection state, the output signal having the pattern including the combination of OUT1=L and OUT2=H is outputted.

According to the second embodiment, if there occurs a fault in the second clock signal supplied to the monitor ICs 20, it is possible to detect that the monitoring state cannot be changed in the monitor ICs 20. Further, it is also possible to have the specific pattern reflecting the detection result generated by the pattern generation sections 54 and 55 be included in the output signal.

It is a matter of course that various modifications can be made to the above embodiments as described below.

In the above embodiments, the monitor section 40 includes the monitor circuits 60 and 70 constituting a dual-redundant monitor circuit to detect overcharge/overdischarge of the battery cell. However, the monitor section 40 may be configured to detect overcharge/overdischarge of the battery cell by a single monitor circuit. Also in this case, the monitor IC 20 can generate the specific pattern indicative of presence of a fault in the clock signal if the output signal is constituted of the combination of the signals OUT1 and OUT2.

In the above embodiments, the monitor IC 20 detects both overcharge and overdischarge of the battery cell. However, the monitor IC 20 may be configured to detect only overcharge of the battery cell. In the above embodiments, the monitor IC 20 is configured to change between the two states, that is between the voltage detection state and the wire breakage detection state. However, the two states may include, other than these states, a state to detect threshold characteristic deviation to detect overcharge or overdischarge of the battery cell.

The state-transition fault detection section 51 is configured to detect a fault in the first clock signal in the first embodiment, and to detect a fault in the second clock signal in the second embodiment. However, the state-transition fault detection section 51 may be configured to detect a fault in both the first and second clock signals.

The above explained preferred embodiments are exemplary of the invention of the present application which is described solely by the claims appended below. It should be understood that modifications of the preferred embodiments may be made as would occur to one of skill in the art.

What is claimed is:

1. A battery fault determination apparatus for a battery pack including a plurality of battery cells connected in series and grouped into unit batteries each including a predetermined number of the battery cells, comprising:
    a plurality of battery monitor sections each provided for a corresponding one of the unit batteries, each of the battery monitor sections monitoring overcharge and wire breakage of the battery cells constituting the corresponding unit battery and outputting a monitoring result as an output signal; and
    a control section configured to cause the plurality of battery monitor sections to make an alternate change between a state to monitor the overcharge and a state to monitor the wire breakage by outputting a control signal to one of the plurality of battery monitor sections on a highest-voltage side;
    the plurality of battery monitor sections being connected in a daisy chain manner so that the output signal and the control signal are successively outputted from the battery monitor section corresponding to the unit battery on a higher voltage side to the battery monitor section corresponding to the unit battery on a lower voltage side so that all of the battery cells are monitored,
    wherein
    each of the plurality of battery monitor sections includes a state-transition fault detection section for receiving the control signal from one of the battery monitor sections connected in the daisy chain manner on a higher voltage side, making a detection whether the change between the state to monitor overcharge and the state to monitor wire breakage has been performed normally in accordance with the control signal, and outputting the output signal included with the detection result, and
    the control section is configured to receive the output signal from one of the battery monitor sections on the lowest voltage side, and determine that there is a fault in the change between the state to monitor overcharge and the state to monitor wire breakage if the detection result included in the received output signal indicates that the change is not performed normally.

2. The battery fault determination apparatus according to claim 1, wherein
    the control signal is constituted of a first clock signal having a first clock frequency and a second clock signal having a second clock frequency lower than the first clock frequency,
    the plurality of battery monitor sections are configured to operate in accordance with the first clock signal and to make the change between the state to monitor the overcharge and the state to monitor the wire breakage, and
    the state-transition fault detection section is configured to, if the first clock signal remains in a same state from when the second clock signal is received the previous time to when the second clock signal is received at this time, output the output signal included with a result indicative of the change not having been performed normally.

3. The battery fault determination apparatus according to claim 1, wherein
    the control signal is constituted of a first clock signal having a first clock frequency and a second clock signal having a second clock frequency lower than the first clock frequency,
    the plurality of battery monitor sections are configured to make the change between the state to monitor the overcharge and the state to monitor the wire breakage upon reception of the second clock signal,
    the control section is configured to output the second clock signal after outputting the first clock signal a predetermined number of times, and
    the state-transition fault detection section is configured to output the output signal included with a result indicative of the change not having been performed normally, if the second clock signal is not received after the first clock signal has been received the predetermined number of times, or if the second clock signal remains in a same state regardless of the first clock signal having been received the predetermined number of times after reception of the second clock signal.

4. The battery fault determination apparatus according to claim 1, wherein
    the output signal is constituted of a first output signal and a second output signal, and
    the state-transition fault detection section is configured to output a detection result indicative of the change not having been performed normally as a pattern where the first output signal is set to a low level and the second output signal is set to a high level.

* * * * *